United States Patent
Chen et al.

(10) Patent No.: US 8,913,445 B2
(45) Date of Patent: Dec. 16, 2014

(54) METHOD AND APPARATUS FOR ADJUSTING DRAIN BIAS OF A MEMORY CELL WITH ADDRESSED AND NEIGHBOR BITS

(75) Inventors: Han-Sung Chen, Hsinchu (TW); Chung-Kuang Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 360 days.

(21) Appl. No.: 13/372,135

(22) Filed: Feb. 13, 2012

(65) Prior Publication Data

US 2013/0208552 A1  Aug. 15, 2013

(51) Int. Cl.
*G11C 7/00* (2006.01)
*G11C 7/22* (2006.01)

(52) U.S. Cl.
USPC ............ 365/189.15; 365/185.14; 365/185.18; 365/185.21

(58) Field of Classification Search
USPC .............. 365/189.15, 185.14, 185.18, 185.21
See application file for complete search history.

(56) References Cited

U.S. PATENT DOCUMENTS

| 6,011,725 | A | 1/2000 | Eitan | |
|---|---|---|---|---|
| 2006/0114722 | A1* | 6/2006 | Yokoi et al. | 365/185.18 |
| 2007/0264766 | A1* | 11/2007 | Lin et al. | 438/199 |
| 2009/0116286 | A1* | 5/2009 | Chong et al. | 365/185.13 |
| 2010/0254194 | A1* | 10/2010 | Chou et al. | 365/185.21 |

OTHER PUBLICATIONS

Lue H-T et al., "Studies of the reverse read method and second-bit effect of 2-bit/cell nitride-trapping device by quasi-two-dimensional model," IEEE Trans. Electron Devices, vol. 53 No. 1, Jan. 2006, pp. 119-125.

* cited by examiner

*Primary Examiner* — Toan Le
(74) *Attorney, Agent, or Firm* — Kenta Suzue; Haynes Beffel & Wolfeld LLP

(57) ABSTRACT

The storage layer such as a nitride layer of a nonvolatile memory cell has two storage parts storing separately addressable data, typically respectively proximate to the source terminal and the drain terminal. The applied drain voltage while sensing the data of one of the storage parts depends on the data stored at the other storage part. If the data stored at the other storage part is represented by a threshold voltage exceeding a minimum threshold voltage, then the applied drain voltage is raised. This technology is useful in read operations and program verify operations to widen the threshold voltage window.

11 Claims, 15 Drawing Sheets

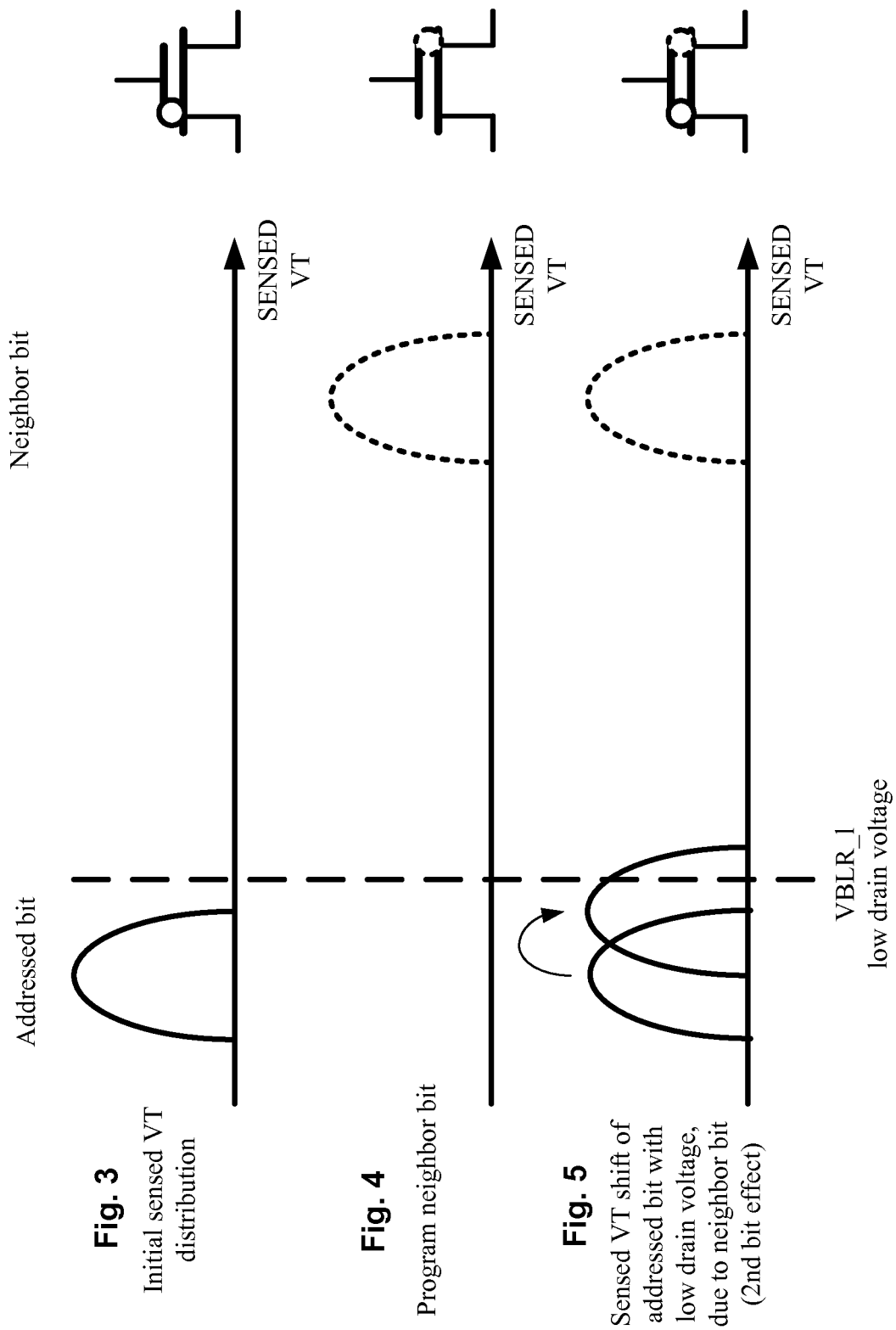

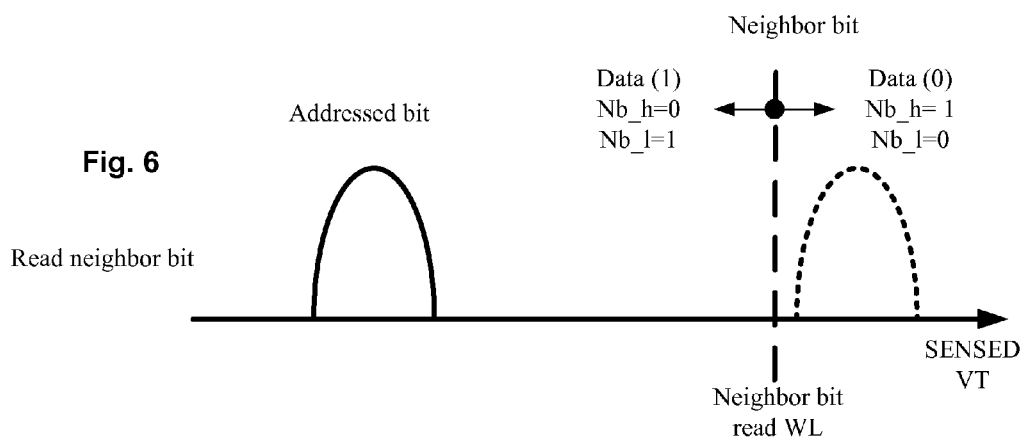
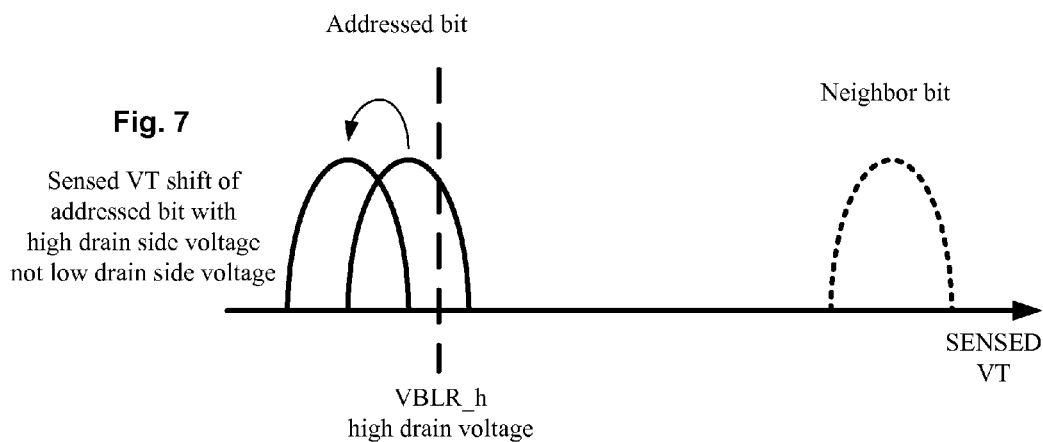

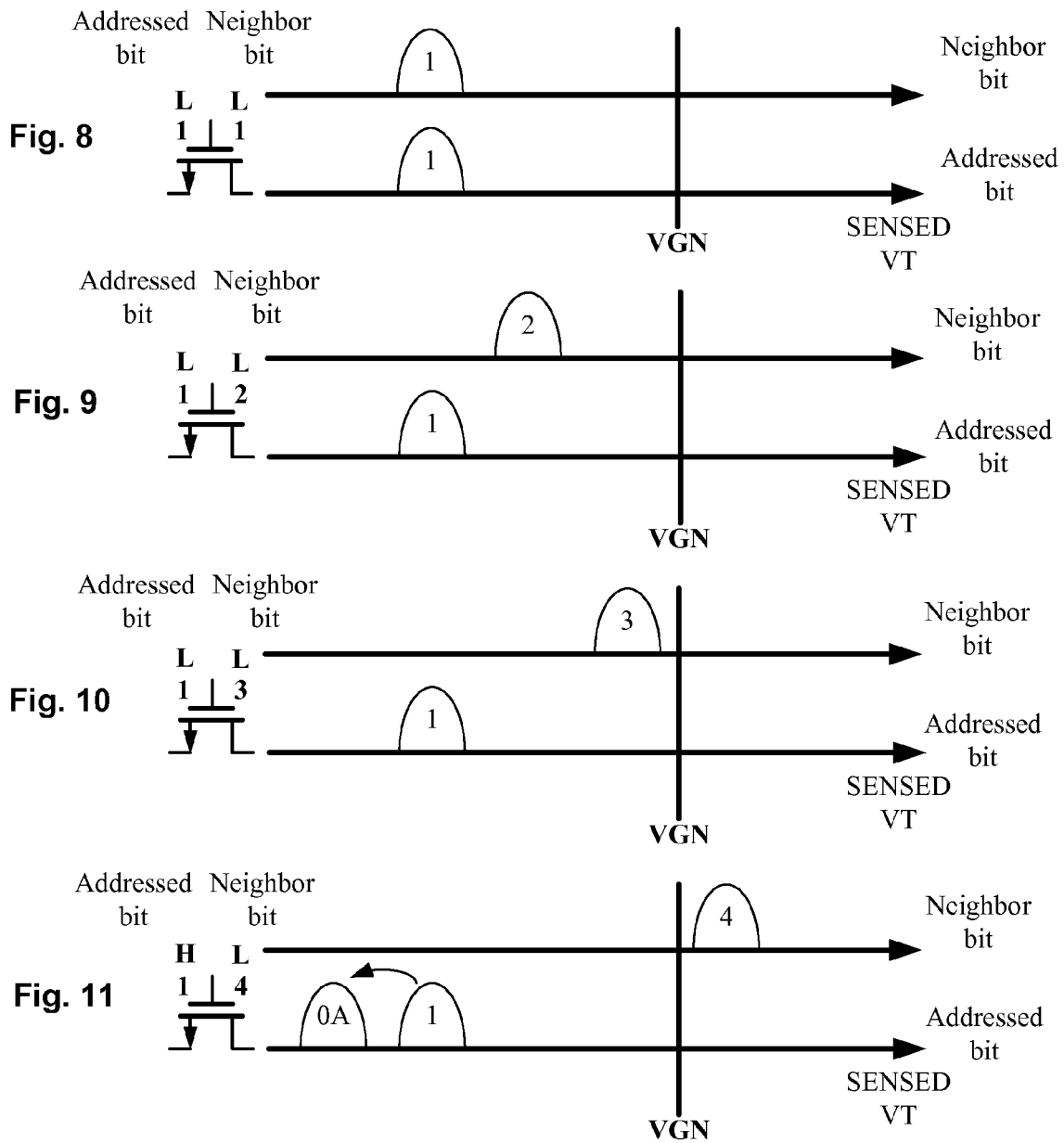

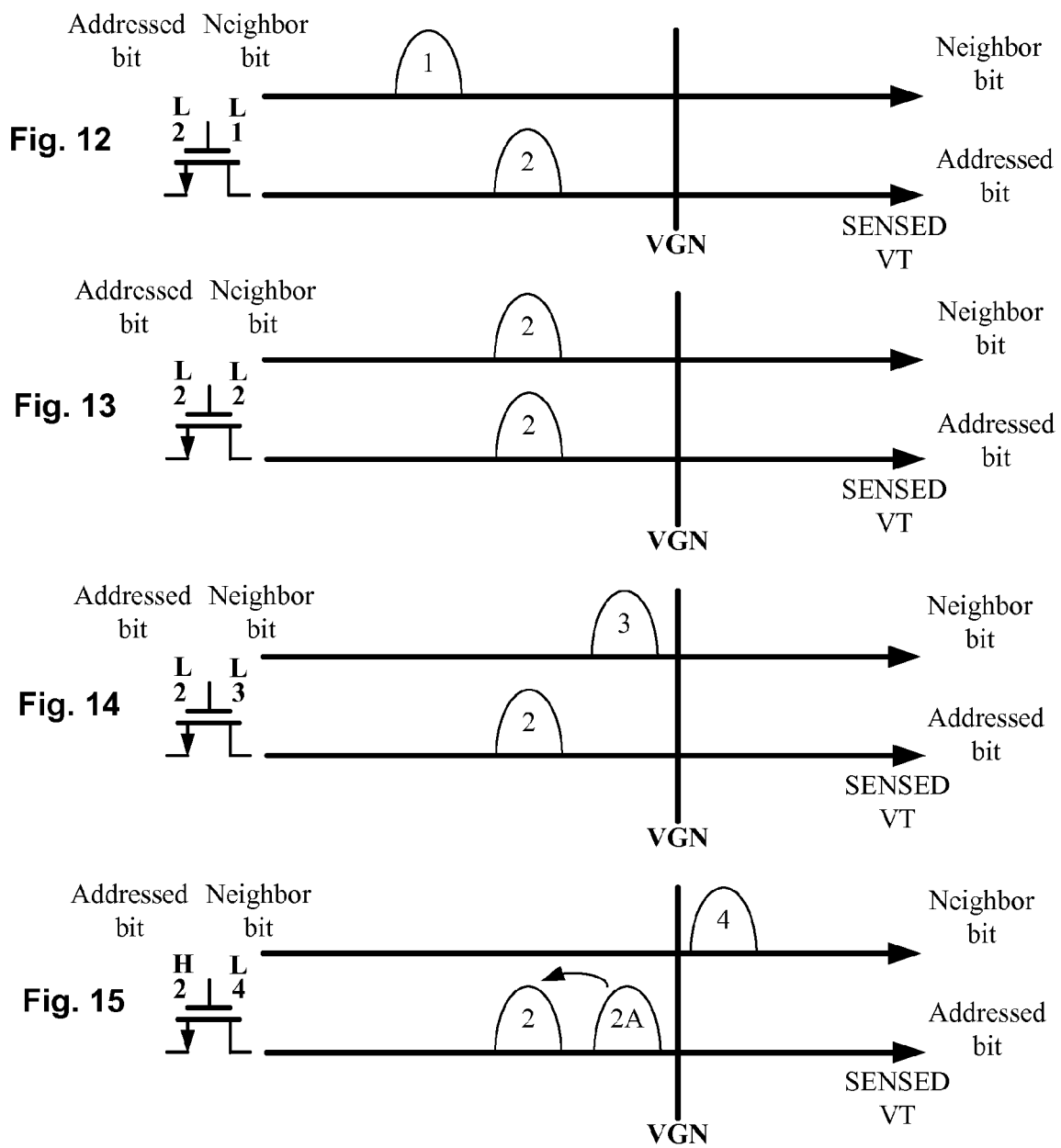

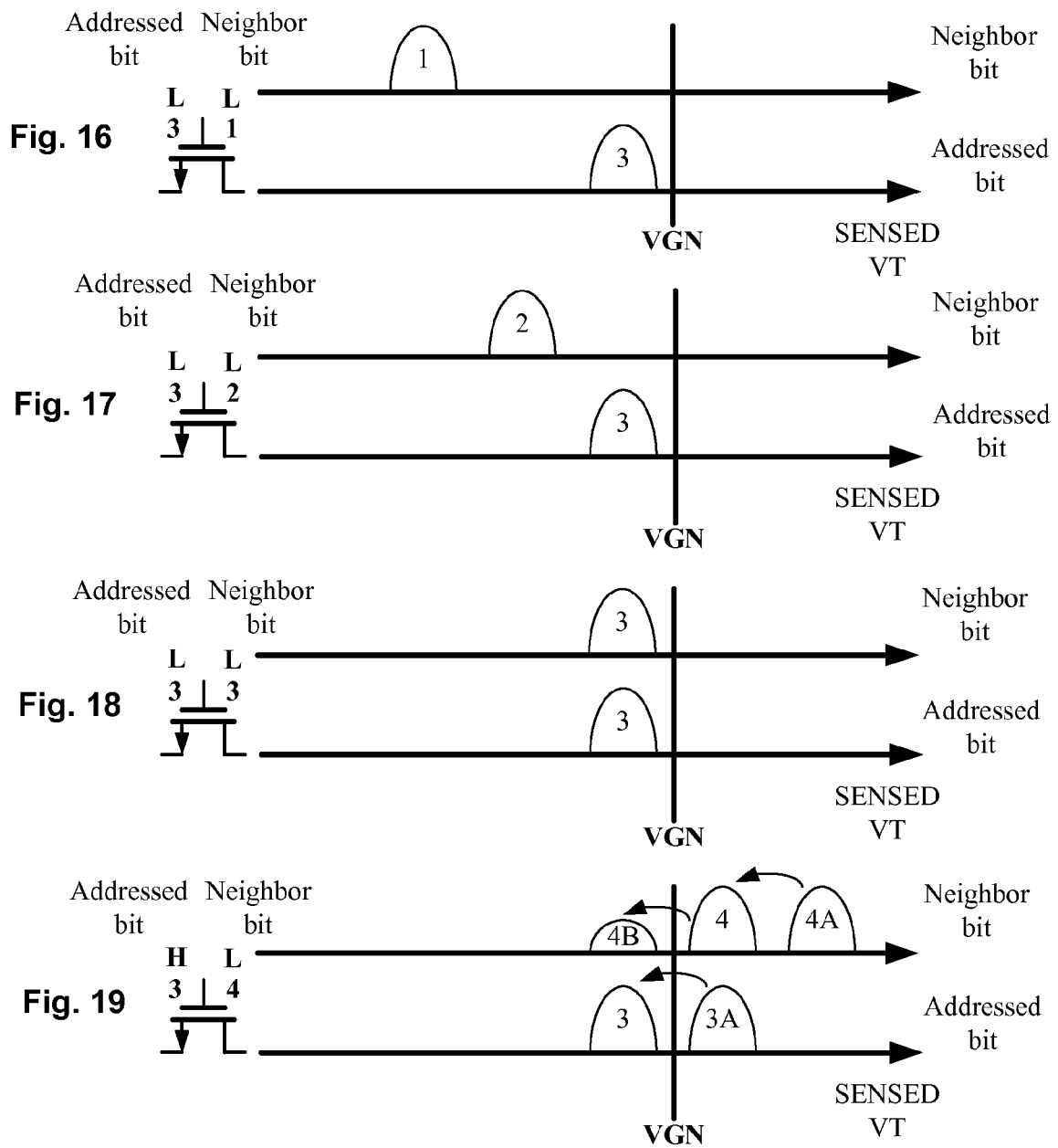

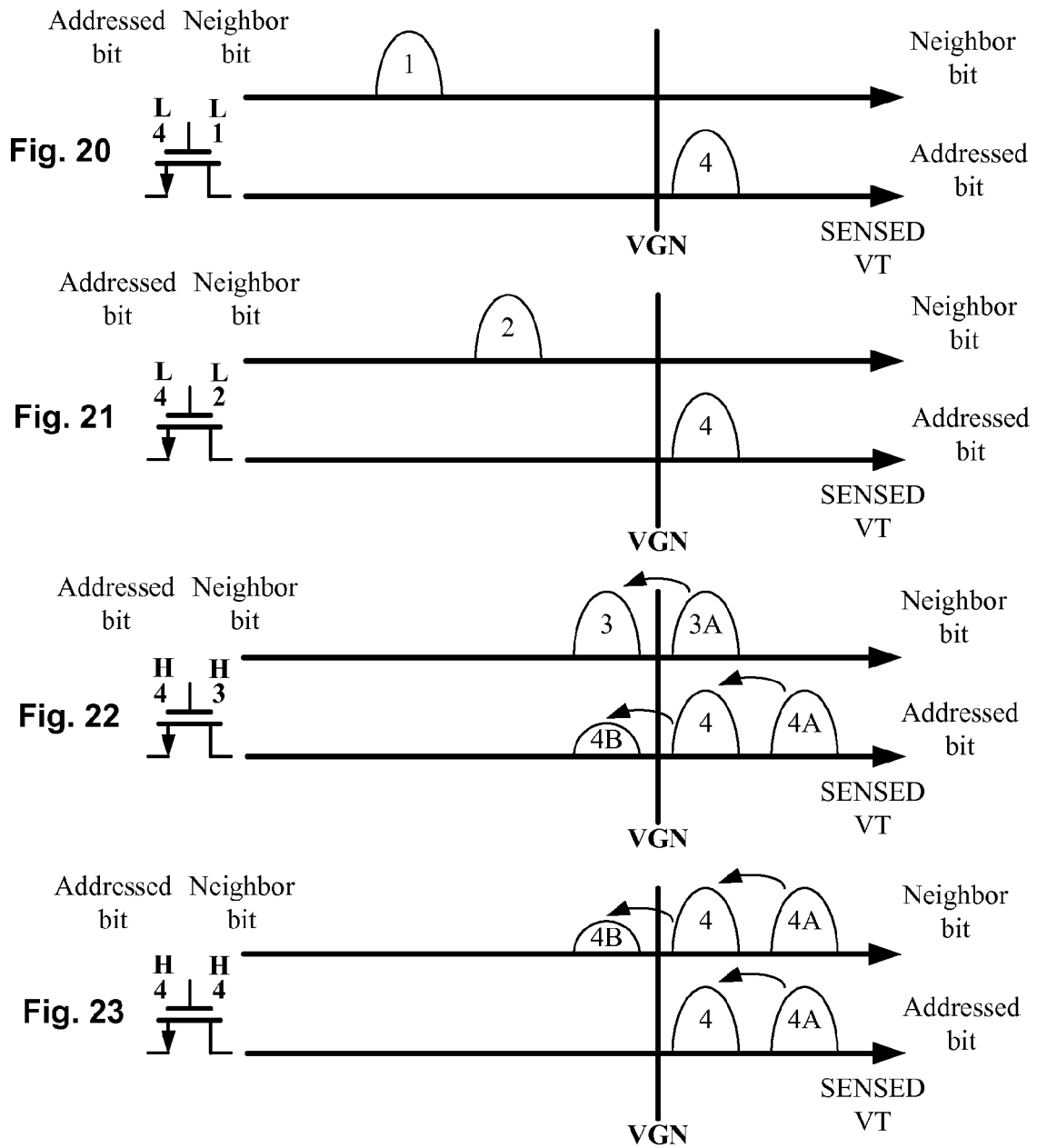

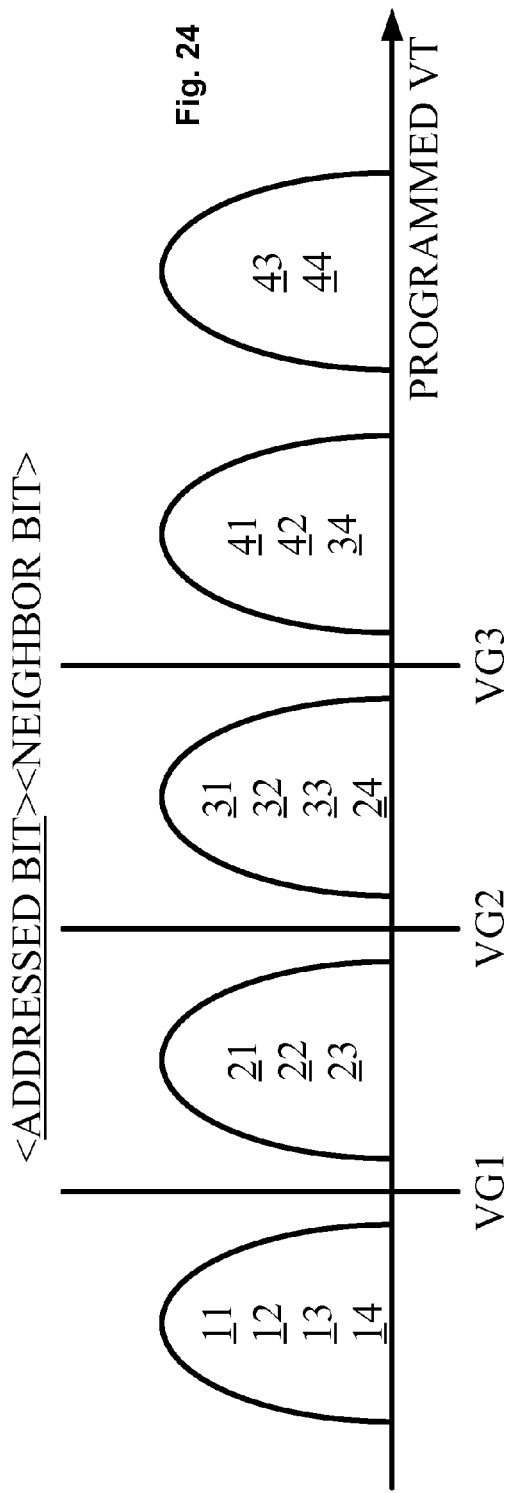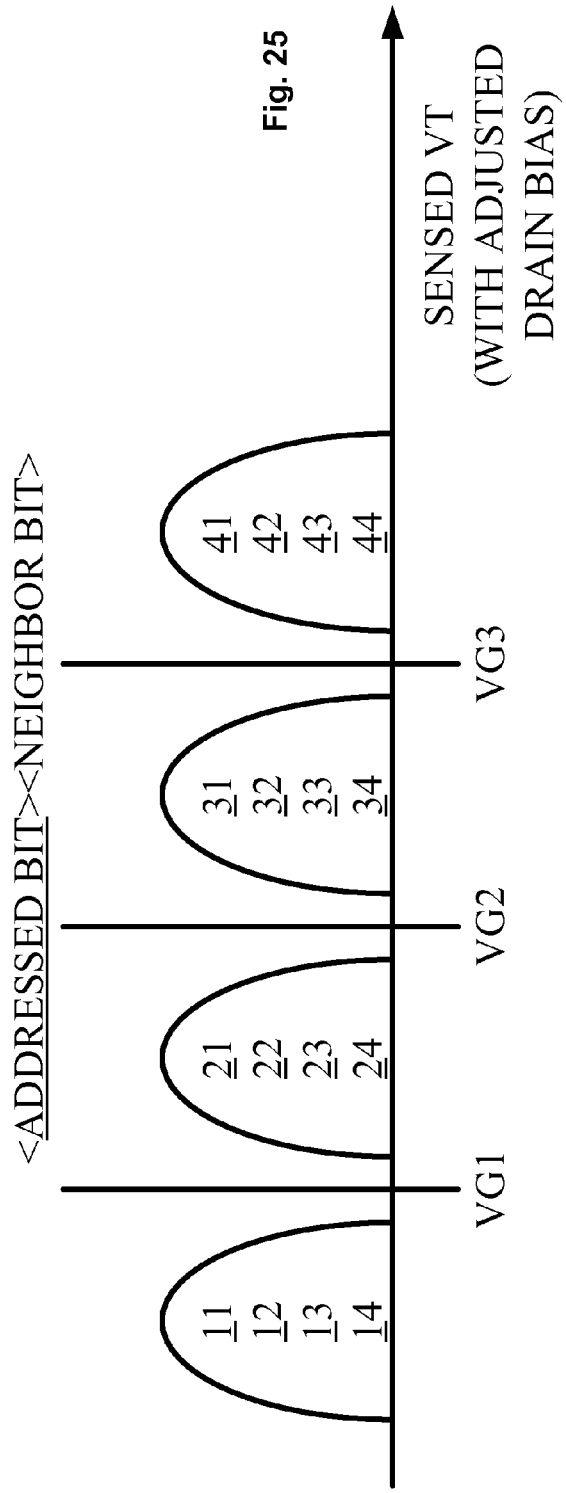

METHOD AND APPARATUS FOR ADJUSTING DRAIN BIAS OF A MEMORY CELL WITH ADDRESSED AND NEIGHBOR BITS

BACKGROUND

Description of Related Art

Charge trapping memory cells such as NROM can be programmed at different localized parts of the silicon nitride storage layer by a mechanism such as channel hot electron (CHE) injection. A single memory cell can store differently addressed data at different parts of the nitride storage layer, proximate to the source and proximate to drain. Threshold voltage ranges of memory cells are associated with the different possible data values that can be stored in each part of the memory cell. For example, in each part of a multi-level cell, 4 threshold voltage ranges can represent 4 distinct data values to store 2 bits. In a triple-level cell, 8 threshold voltage ranges can represent 8 distinct data values to store 3 bits.

However, because of the second bit effect, which limits the available threshold voltage window of a memory cell, the data stored at different parts of the nitride storage layer affect each other. The different parts are referred to here as the "addressed bit" and the "neighbor bit" of the same memory cell. In this context "bit" does not limit data storage to a single bit of data, and instead refers to different physical locations of the charge storage layer which can each store 1, 2, 3, or more bits of data. The addressed bit is the physical data location which is addressed in a command such as program or read, and the neighbor bit is the adjacent physical data location in the same memory cell as the addressed bit. The second bit effect is described next.

When reading an addressed part of the memory cell, a reverse read operation is performed as described in U.S. Pat. No. 6,011,725, incorporated by reference, in which the polarity of voltages applied to the source and drain is reversed from the CHE programming operation performed on the addressed part of the memory cell. The reverse read operation performed on the addressed part of the memory cell must "punch through" the channel located under the neighbor bit of the same memory cell. When the neighbor bit of the memory cell stores a data value associated with a high threshold voltage, then the reverse read current is reduced. This is the second bit effect which effectively narrows the available threshold voltage window, as described in "Studies of the reverse read method and second-bit effect of 2-bit/cell nitride-trapping device by quasi-two-dimensional model" by Hang-Ting Lue et al., IEEE Transactions on Electron Devices, VOl. 43, No. 1, page 119, January 2006, incorporated by reference.

The second bit effect can be addressed by increasing the voltage magnitude applied during the reverse read operation. However, such increased voltage magnitudes is associated with a read disturb effect of mistakenly programming the neighboring bit while reading the addressed bit.

Accordingly, it would be desirable to make use of a wider threshold voltage window by improving the second bit effect, while minimizing accompanying disadvantages such as read disturb programming.

SUMMARY

The technology described here includes an integrated circuit with a nonvolatile memory cell and control circuitry. The nonvolatile memory cell includes a first current carrying terminal (source or drain), a second current carrying terminal (drain or source), and a gate. The nonvolatile memory cell has multiple storage parts that separately store data. A first storage part of the nonvolatile memory cell is proximate to the first current carrying terminal and stores first data. A second storage part of the nonvolatile memory cell is proximate to the second current carrying terminal and stores second data. The first storage part and the second storage part can be different parts of a nitride storage layer.

The control circuitry applies a read bias arrangement to the first current carrying terminal, the second current carrying terminal, and the gate of the nonvolatile memory cell. The read bias arrangement is applied to read one of the first data and the second data stored on the memory cell, and the read bias arrangement depends on the other of the first data and the second data. For example, the first data determines a voltage applied to the first current carrying terminal in the read bias arrangement applied to read the second data. In a reverse read operation performed on the second data, electrons flow from the second current carrying terminal to the first current carrying terminal. To reduce the second bit effect, reverse read current is increased by raising the voltage applied to the first current carrying terminal. To avoid read disturb (unwanted programming of the first data), the voltage applied to the first current carrying terminal is raised if the first data is represented by a first threshold voltage of the first storage part exceeding a minimum threshold voltage. If the first data is represented by a threshold voltage of the first storage part not exceeding a minimum threshold voltage, then a lower voltage is applied to the first current carrying terminal. Some embodiments of this technology include a memory storing data bits determined by whether the first data is represented by a threshold voltage that exceeds a minimum threshold voltage. The control circuitry reads the data bits from the memory to control whether the first voltage or the second voltage is applied to the first current carrying terminal in the program verify bias arrangement applied to program verify the second data.

Similarly, the second data determines a voltage applied to the second current carrying terminal in the read bias arrangement applied to read the first data. As described above with the first current carrying terminal, to avoid read disturb (unwanted programming of the first data), the voltage applied to the second current carrying terminal is raised if the second data is represented by a threshold voltage of the second storage part exceeding a minimum threshold voltage. If the second data is represented by a threshold voltage of the second storage part not exceeding a minimum threshold voltage, then a lower voltage is applied to the second current carrying terminal.

Whether the first current carrying terminal voltage is raised or the second current carrying terminal voltage is raised, the raised voltage terminal can be referred to as the drain voltage, because the drain terminal is the higher voltage current carrying terminal which is the destination of electron flow (opposite direction from current flow). Also, whether the first data at the first storage part is read, or the second data at the second storage part is read, the storage part being read can be referred to as the addressed bit, and the storage part not being can be referred to as the neighboring bit. As previously described, "bit" in this context refers to a particular storage location of a memory cell, and does not limit the storage location to storing a single bit. Each of the addressed bit and the neighboring bit can store 1, 2, 3, or some other number of data bits.

When the drain voltage is raised, because the second bit effect is reduced, a shift occurs in the sensed threshold voltage range. Accordingly, there can be multiple programmed threshold voltage ranges that correspond to the same sensed threshold voltage range. For an addressed bit, the data stored at the neighboring bit determines the particular programmed threshold voltage range which corresponds to the sensed threshold voltage. Also, the total number of programmed threshold voltage ranges exceeds the total number of sensed threshold voltage ranges.

As described above, the read bias arrangement is applied to read one of the first data and the second data stored on the memory cell, and the read bias arrangement depends on the other of the first data and the second data. Prior to applying the read bias arrangement, the value is determined of the other of the first data and the second data. In some embodiments of the described technology, a read operation determines the other of the first data and the second data.

Other embodiments of the described technology are disclosed herein. Those embodiments about program verify can be directed to read instead.

Another technology described herein is applied to the program verify bias arrangement instead of the read bias arrangement. A program verify operation determines whether a minimum amount of programming has been performed on a memory cell, whereas a read operation determines whether the threshold voltage of a memory cell is above or below an intermediate threshold voltage between two nominal threshold voltage ranges associated with different data values.

The program verify bias arrangement is applied to program verify one of the first data and the second data stored on the memory cell, and the program verify bias arrangement depends on the other of the first data and the second data. Prior to applying the program verify bias arrangement, the value is determined of the other of the first data and the second data. In some embodiments of the described technology, a read operation determines the other of the first data and the second data. In other embodiments of the described technology, input data of a programming command determines the other of the first data and the second data.

Other embodiments of the described technology are disclosed herein. Those embodiments about read can be applied to program verify instead.

Another technology described herein is a memory method, comprising:

applying a read bias arrangement to a first current carrying terminal, a second current carrying terminal, and a gate of a nonvolatile memory cell, the read bias arrangement applied to read one of first data and the second data, the read bias arrangement depending on the other of the first data and the second data, the first data stored at a first storage part proximate to the first current carrying terminal and the second data stored at a second storage part proximate to the second current carrying terminal.

Other embodiments of the described technology are disclosed herein. Those embodiments about program verify can be directed to read instead.

Another technology described herein is a memory method, comprising:

applying a program verify bias arrangement to a first current carrying terminal, a second current carrying terminal, and a gate of a nonvolatile memory cell, the program verify bias arrangement applied to program verify one of first data and the second data, the program verify bias arrangement depending on the other of the first data and the second data, the first data stored at a first storage part proximate to the first current carrying terminal and the second data stored at a second storage part proximate to the second current carrying terminal.

Other embodiments of the described technology are disclosed herein. Those embodiments about read can be applied to program verify instead.

BRIEF DESCRIPTION OF THE DRAWINGS

FIGS. 3-5 are threshold voltage diagrams showing the second bit effect of a neighboring bit on an addressed bit.

FIGS. 6-7 are threshold voltage diagrams of an increased drain voltage that reduces the second bit effect of a neighboring bit on an addressed bit.

FIGS. 8-23 are threshold voltage diagrams of an addressed bit and a neighbor bit, showing various data permutations of an addressed bit and a neighbor bit, and the reduced second bit effect on several of the permutations.

FIGS. 24-25 are threshold voltage diagrams showing programmed threshold voltage ranges and sensed threshold voltage ranges for various data permutations of an addressed bit and a neighbor bit.

DETAILED DESCRIPTION

The shown examples have four possible data values in a memory cell. Other examples can have two possible data values, eight possible data values, or some other possible number of data values.

Figure 1:
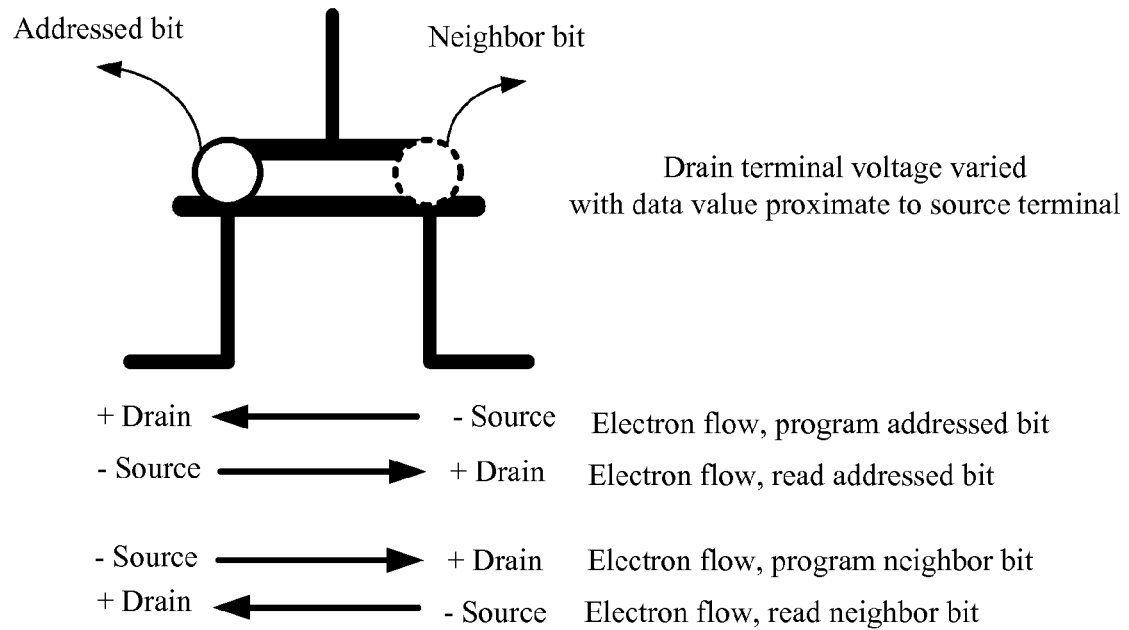
FIGS. 1-2 are diagrams of a nonvolatile memory cell with an addressed bit and a neighboring bit that store separately addressed data.
Figure 2:
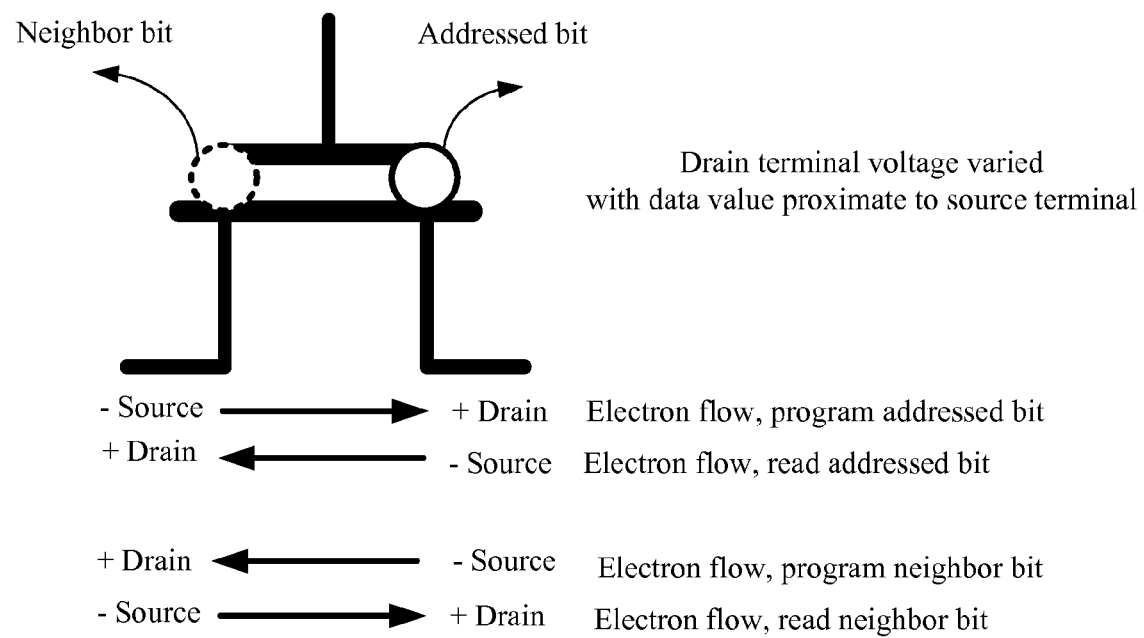

FIGS. 1-2 are diagrams of a nonvolatile memory cell with an addressed bit and a neighboring bit that store separately addressed data.

FIG. 1 shows a nonvolatile memory cell with data stored at different parts of the nitride storage layer. The different parts are referred to here as the "addressed bit" and the "neighbor bit" of the same memory cell. In this context "bit" refers to different physical locations of the charge storage layer which can each store 1, 2, 3, or more bits of data. The memory cell has a gate terminal, and two current carrying terminals—the source and drain terminals. The drain terminal voltage is varied with the data value proximate to the source terminal. The particular current carrying terminal which is the drain terminal varies, because the particular current carrying terminal which acts as the sink for electron flow varies. In FIG. 1, the addressed bit is at the left part of the charge storage layer of the memory cell and proximate to the left current carrying terminal, and the neighbor bit is at the right part of the charge storage layer of the memory cell and proximate to the right current carrying terminal. The designation of the right and left current carrying terminals as the lower voltage source and the higher voltage drain, and the direction of electron flow to the drain, are shown for the different permutations of program and reverse read, and addressed bit and neighbor bit.

FIG. 2 shows a nonvolatile memory cell with data stored at different parts of the nitride storage layer, as in FIG. 1. In contrast with FIG. 1, the addressed bit is at the right part of the charge storage layer of the memory cell and proximate to the right current carrying terminal, and the neighbor bit is at the left part of the charge storage layer of the memory cell and proximate to the left current carrying terminal. Because the positions of the addressed bit and the neighbor bit are reversed in FIG. 2 with respect to FIG. 1, the positions of the source and drain and the direction of electron flow are reversed in FIG. 2 with respect to FIG. 1.

FIGS. 3-5 are threshold voltage diagrams showing the second bit effect of a neighboring bit on an addressed bit. A low drain voltage VBLR_l is applied to the drain terminal while sensing the addressed bit. The sensed VT distribution of the addressed bit and the physical position of the addressed bit in the memory cell are shown in solid lines. The sensed VT distribution of the neighbor bit and the physical position of the neighbor bit in the memory cell are shown in dashed lines.

In FIG. 3, the addressed bit has an initial sensed VT distribution. The accompanying diagram shows the addressed bit at the left part of the charge storage layer of the memory cell. The neighbor bit has not been programmed to a high VT distribution, so the second bit effect is not evident.

In FIG. 4, the neighbor bit is programmed to a high VT distribution. The accompanying diagram shows the neighbor bit at the right part of the charge storage layer of the memory cell.

In FIG. 5, the addressed bit shift from the initial sensed VT distribution, to a higher sensed VT distribution. The shift in the "sensed VT distribution" does not reflect a change in the "programmed VT distribution", because no charge has been programmed to the addressed bit. Instead, the shift in VT distribution of the addressed bit results from the second bit effect. The sensed VT distribution of the addressed bit shifts higher, because the portion of the channel under the neighbor bit has a higher threshold voltage, reducing sense current and increasing the sensed VT of the addressed bit.

FIGS. 6-7 are threshold voltage diagrams of an increased drain voltage that reduces the second bit effect of a neighboring bit on an addressed bit. The sensed VT distribution of the addressed bit is shown in solid lines. The sensed VT distribution of the neighbor bit is shown in dashed lines.

In FIG. 6, the value of the neighbor bit is sensed, to determine the drain voltage for sensing the addressed bit. The neighbor bit WL read voltage is applied to sense the neighbor bit. If the sensed VT of the neighbor bit exceeds the VT threshold from the WL read voltage, then the result is data 0, Nb_h (neighbor bit high)=1, Nb_l (neighbor bit low)=0. If the sensed VT of the neighbor bit does not exceed the threshold, then the result is data 1, Nb_h=0, Nb_l=1. In this example, the sensed VT of the neighbor bit does exceed the threshold, and the result is data 1, Nb_h=0, Nb_l=1.

In FIG. 7, because of the FIG. 6 result, the high drain voltage VBLR_h is applied to sense the addressed bit. The high drain voltage tends to increase the sense current, which tends to counteract the second bit effect. Because of the decreased second bit effect, the VT distribution of the addressed bit shifts down. This downward shift in the VT distribution widens the available VT window.

FIGS. 8-23 are threshold voltage diagrams of an addressed bit and a neighbor bit, showing various data permutations of an addressed bit and a neighbor bit, and the reduced second bit effect on several of the permutations. The "H" or "L" above the addressed bit data value and the neighbor bit data value respectively indicate whether the high drain voltage VBLR_h or the low drain voltage VBLR_l is applied to sense the particular bit. The low drain voltage VBLR_l is applied to sense the addressed bit data value, if the sensed neighbor bit VT does not exceed the minimum threshold VGN. The high drain voltage VBLR_h is applied to sense the addressed bit data value, if the sensed neighbor bit VT exceeds the minimum threshold VGN. The low drain voltage VBLR_l is applied to sense the neighbor bit data value, if the sensed addressed bit VT does not exceed the minimum threshold VGN. The high drain voltage VBLR_h is applied to sense the neighbor bit data value, if the sensed addressed bit VT exceeds the minimum threshold VGN. The minimum threshold shown is between the programmed threshold distributions for the data values "3" and "4". Other embodiments can apply another minimum threshold.

FIGS. 8-11 are the threshold voltage diagrams where the addressed bit has the data value "1" (out of data values 1-4, from lowest to highest VT). In FIG. 8, the neighbor bit has the data value "1". In FIG. 9, the neighbor bit has the data value "2". In FIG. 10, the neighbor bit has the data value "3". In FIG. 11, the neighbor bit has the data value "4". Because the neighbor bit exceeds the minimum threshold VGN, the high drain voltage VBLR_h is applied to sense the addressed bit. The programmed VT "1" of the addressed bit is sensed as the reduced VT "0A". Although shown as different programmed VT distributions, the "1" and "0A" VT can be treated the same in that both are below the VG1 threshold which senses the difference between the lowest VT data value and any higher VT data values.

FIGS. 12-15 are the threshold voltage diagrams where the addressed bit has the data value "2" (out of data values 1-4, from lowest to highest VT). In FIG. 12, the neighbor bit has the data value "1". In FIG. 13, the neighbor bit has the data value "2". In FIG. 14, the neighbor bit has the data value "3". In FIG. 15, the neighbor bit has the data value "4". Because the neighbor bit exceeds the minimum threshold VGN, the high drain voltage VBLR_h is applied to sense the addressed bit. The programmed VT "2A" of the addressed bit is sensed as the reduced VT "2". The addressed bit is programmed to the VT "2A" so that the sensed VT is "2".

FIGS. 16-19 are the threshold voltage diagrams where the addressed bit has the data value "3" (out of data values 1-4, from lowest to highest VT). In FIG. 16, the neighbor bit has the data value "1". In FIG. 17, the neighbor bit has the data value "2". In FIG. 18, the neighbor bit has the data value "3". In FIG. 19, the neighbor bit has the data value "4". Because the neighbor bit exceeds the minimum threshold VGN, the high drain voltage VBLR_h is applied to sense the addressed bit. The programmed VT "3A" of the addressed bit is sensed as the reduced VT "3". The addressed bit is programmed to the VT "3A" so that the sensed VT is "3". Because the addressed bit "3A" also exceeds the minimum threshold VGN, the neighbor bit VT is then also sensed with the high drain voltage VBLR_h. The neighbor bit VT is programmed to the VT "4A" so that the neighbor bit VT is sensed as the reduced VT "4". Otherwise, if the neighbor bit VT is left at the VT "4" and not programmed to the VT "4A", then the neighbor bit VT is sensed as the VT "4B" reduced from the VT "4".

FIGS. 20-23 are the threshold voltage diagrams where the addressed bit has the data value "4" (out of data values 1-4, from lowest to highest VT). In FIG. 20, the neighbor bit has the data value "1". In FIG. 21, the neighbor bit has the data value "2". In FIG. 22, the neighbor bit has the data value "3". As shown in FIG. 19 which shows the converse bit arrangement as FIG. 22 with reversed addressed bit and neighbor bit values, the programmed VT of the neighbor bit is "3A", which is sensed as the reduced VT "3". Because the neighbor bit "3A" exceeds the minimum threshold VGN, the neighbor bit VT is sensed with the high drain voltage VBLR_h. The addressed bit VT is programmed to the VT "4A" so that the addressed bit VT is sensed as the reduced VT "4". If the addressed bit VT is left at the VT "4" and not programmed to the VT "4A", then the addressed bit VT is sensed as the VT "4B" reduced from the VT "4". In FIG. 23, the neighbor bit has the data value "4". Because the neighbor bit exceeds the minimum threshold VGN, the high drain voltage VBLR_h is applied to sense the addressed bit. The programmed VT "4A" of the addressed bit is sensed as the reduced VT "4". The addressed bit is programmed to the VT "4A" so that the sensed VT is "4". Because the addressed bit "4A" also exceeds the minimum threshold VGN, the neighbor bit VT is then also sensed with the high drain voltage VBLR_h. The neighbor bit VT is programmed to the VT "4A" so that neighbor bit VT is sensed as the reduced VT "4". Otherwise, if the neighbor bit VT is left at the VT "4" and not programmed to the VT "4A", then the neighbor bit VT is sensed as the VT "4B" reduced from the VT "4".

FIGS. 24-25 are threshold voltage diagrams showing programmed threshold voltage ranges and sensed threshold voltage ranges for various data permutations of an addressed bit and a neighbor bit. The addressed bit is underlined, and the neighbor bit is not underlined.

FIG. 24 shows programmed VT distributions defined by the charge added while programming the memory cell. Because the underlying amount of charge stored on a memory cell is generally unchanged during sensing (excepting the read disturb effect), the programmed VT generally does not change with read bias changes.

FIG. 25 shows sensed VT distributions, which varies with the drain voltage applied while sensing. The sensed VT in FIG. 25 directly determines the sensed data values stored in a memory cell, and the number of sensed VT distributions is equivalent to the number of data values represented by the addressed bit or neighboring bit.

As discussed in connection with FIGS. 15, 19, 22, and 23, the programmed VT distributions anticipate the VT shift caused from a high drain bias and resulting in the sensed VT distributions. So the programmed VT distributions of FIG. 24 do not include the effect of the high drain bias which shifts the VT distributions to lower magnitudes. The sensed VT distributions of FIG. 25 include the effect of the high drain bias which shifts the VT distributions to lower magnitudes. Accordingly, the <addressed bit><neighbor bit> programmed VT distribution of <2><4> in FIG. 24 is shifted into a lower sensed VT distribution in FIG. 25. A similar shift to lower VT magnitudes from the programmed VT distribution to the sensed VT distribution is shown for the <addressed bit><neighbor bit> combinations <3><4>, <4><3>, and <4><4>.

Comparison of the programmed VT distributions of FIG. 24 and the sensed VT distributions of FIG. 25 indicates that a particular sensed data value can be represented by multiple programmed VT ranges. Also, whereas the number of sensed VT ranges is equal to the number of data values that can be stored by the addressed bit or the neighbor bit, the number of programmed VT ranges exceeds the number of data values that can be stored by the addressed bit or the neighbor bit.

Figure 26:
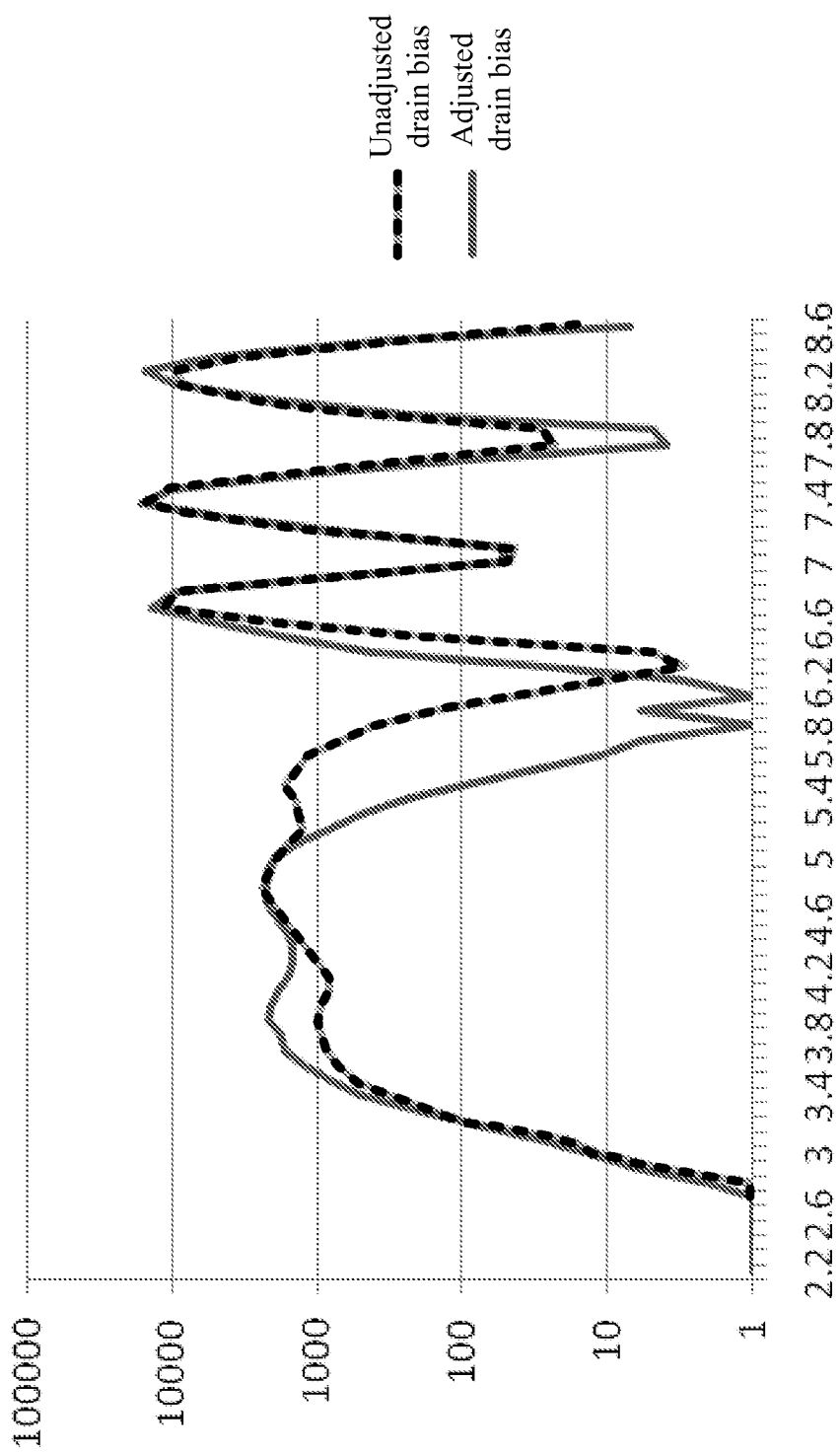
FIG. 26 contrasts the threshold voltage distributions for different drain bias schemes that adjust and do not adjust the drain bias depending on the data value of a neighboring bit.

FIG. 26 contrasts the threshold voltage distributions for different drain bias schemes that adjust and do not adjust the drain bias depending on the data value of a neighboring bit.

The vertical axis is a log scale showing the number of bits in the simulated test memory array having a particular sensed VT in the horizontal axis. The dashed curve corresponds to the sensing process which does not adjust the drain bias according to the value of the neighbor bit. The solid curve corresponds to the sensing process which does adjust the drain bias according to the value of the neighbor bit. The graph shows that the adjusted drain bias widens the VT window, particularly between the two lowest VT distributions which have a widened VT gap of about 0.5 V.

Figure 27:
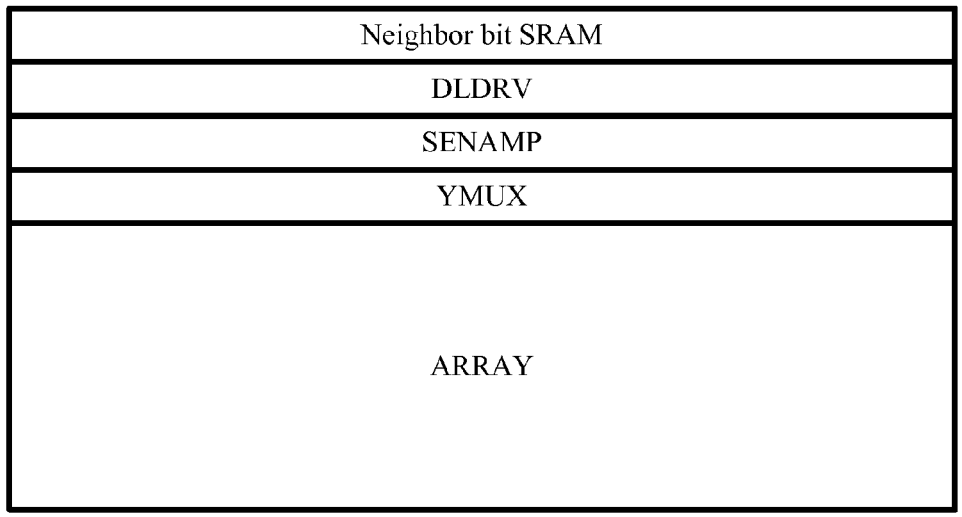
FIG. 27 is a general block diagram with a drain line drive circuit block having a drain voltage determined by the data stored in an SRAM block.

FIG. 27 is a general block diagram with a drain line drive circuit block having a drain voltage determined by the data stored in an SRAM block. From top to bottom, the blocks include neighbor bit SRAM block, drain line drive DLDRV block, SENAMP sense amplifiers, YMUX column multiple, SENAMP sense amplifiers, YMUX column multiplexers, and ARRAY memory array.

Figure 28:
FIG. 28 is a general SRAM block that generates signals to control the drain voltage from a drain line drive circuit block.

FIG. 28 is a general SRAM block that generates signals to control the drain voltage from a drain line drive circuit block. An SRAM memory generates the signals Nb_h and Nb_l as explained in connection with FIG. 6. Nb_h (neighbor bit high)=1 and Nb_l (neighbor bit low)=0 if the sensed VT of the neighbor bit exceeds the VT threshold from the WL read voltage, such that the high drain voltage can be applied to sense the addressed bit. Nb_h (neighbor bit high)=0 and Nb_l (neighbor bit low)=1 if the sensed VT of the neighbor bit does not exceed the VT threshold from the WL read voltage, such that the low drain voltage is applied to sense the addressed bit.

Figure 29:
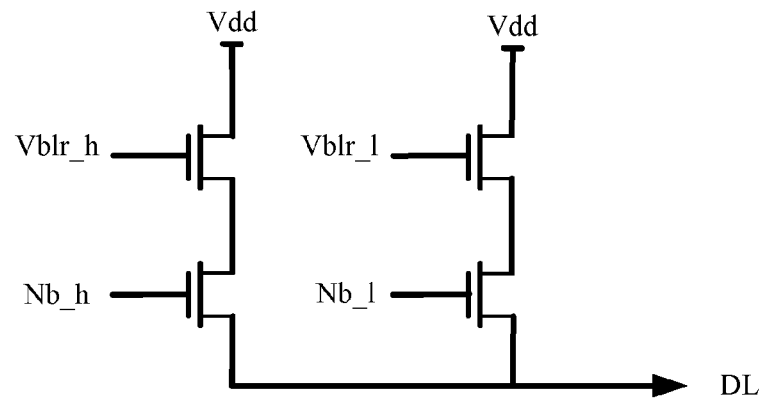
FIG. 29 is circuit diagram of an example drain line drive circuit.

FIG. 29 is circuit diagram of an example drain line drive circuit. Two parallel NAND strings connect the Vdd supply voltage and the DL drain line. The left NAND string receives the gate voltages Vblr_h and Nb_h. The right NAND string receives the gate voltages Vblr_l and Nb_l. If Nb_h (neighbor bit high)=1 and Nb_l (neighbor bit low)=0, then the left NAND string is turned on and the right NAND string is turned off. DL drain line then has the value Vblr_h (less a transistor VT). If Nb_h (neighbor bit high)=0 and Nb_l (neighbor bit low)=1, then the left NAND string is turned off and the right NAND string is turned on. DL drain line then has the value Vblr_l (less a transistor VT).

Figure 30:
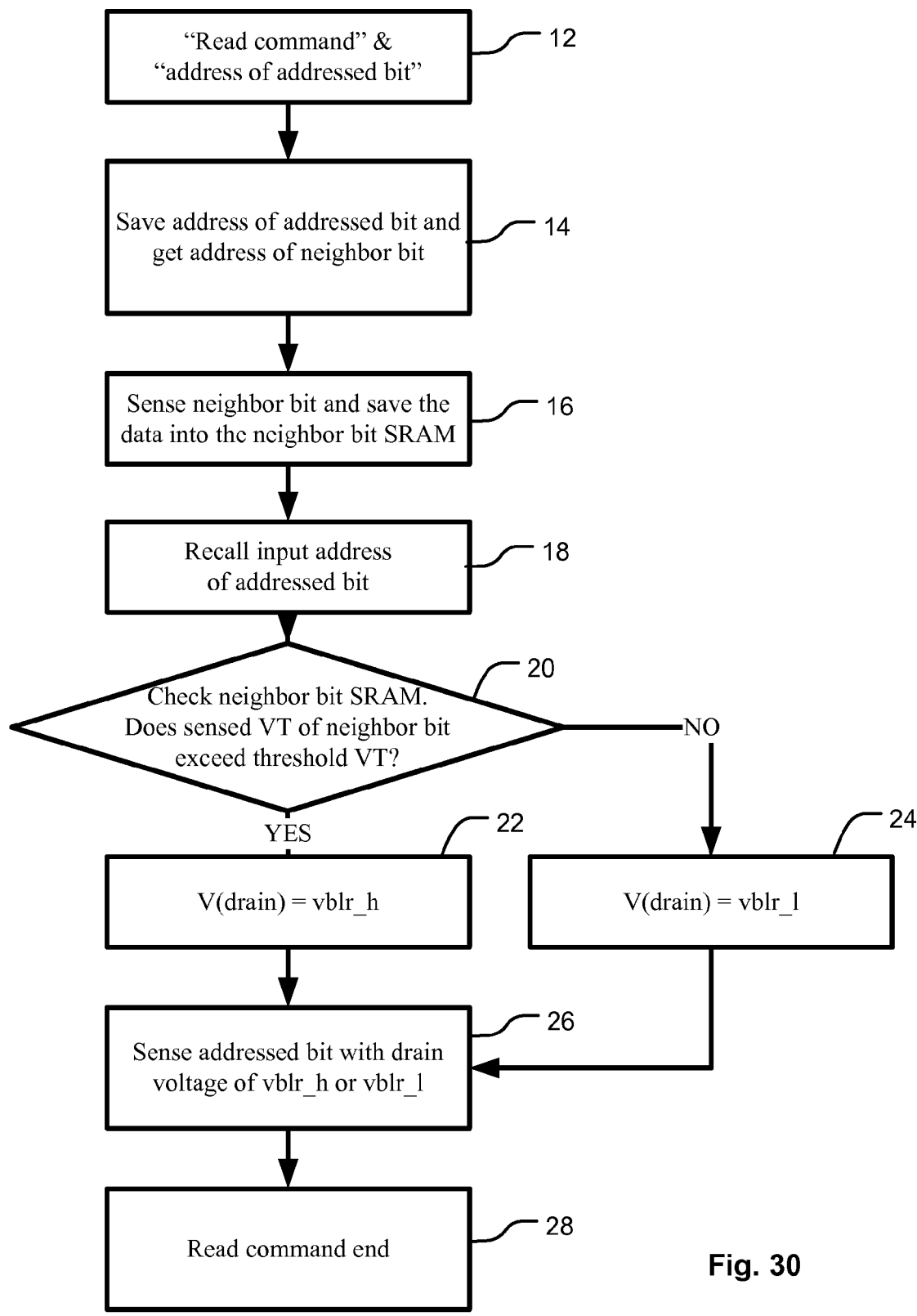
FIG. 30 is a process flow of a read operation with an adjusted drain bias depending on the value of the neighboring bit.

FIG. 30 is a process flow of a read operation with an adjusted drain bias depending on the value of the neighboring bit. At 12, the read command is received with the address of the addressed bit of a memory cell. At 14, the address of the addressed bit is saved. Based on the addressed bit, the address of the neighbor bit is retrieved. A table can index together the addresses of the neighbor bit address and the addressed bit address, allowing the addressed bit to be remapped to the neighbor bit. At 16, with the neighbor bit address, the neighbor bit is sensed. By default, the low drain voltage is used. As shown in FIG. 6, data is saved that indicates whether the neighbor bit value has a sufficiently high VT to permit the high drain voltage for the sensing the addressed bit. An example memory saving the data is shown at FIG. 28. At 18, the address of the addressed bit is recalled, which was save at 14. At 20, the neighbor bit SRAM is checked, and it is determined whether the sensed VT of the neighbor bit exceeds a threshold VT, based on the saved data at 16. An example determination is performed by the circuit of FIG. 29. At 22, if the sensed VT of the neighbor bit exceeds a threshold VT, the drain voltage is vblr_h. At 24, if the sensed VT of the neighbor bit does not exceed a threshold VT, the drain voltage is vblr_l. At 26, the addressed bit is sensed with the drain voltage of vblr_h or vblr_l. At 28, the read command ends.

Figure 31:
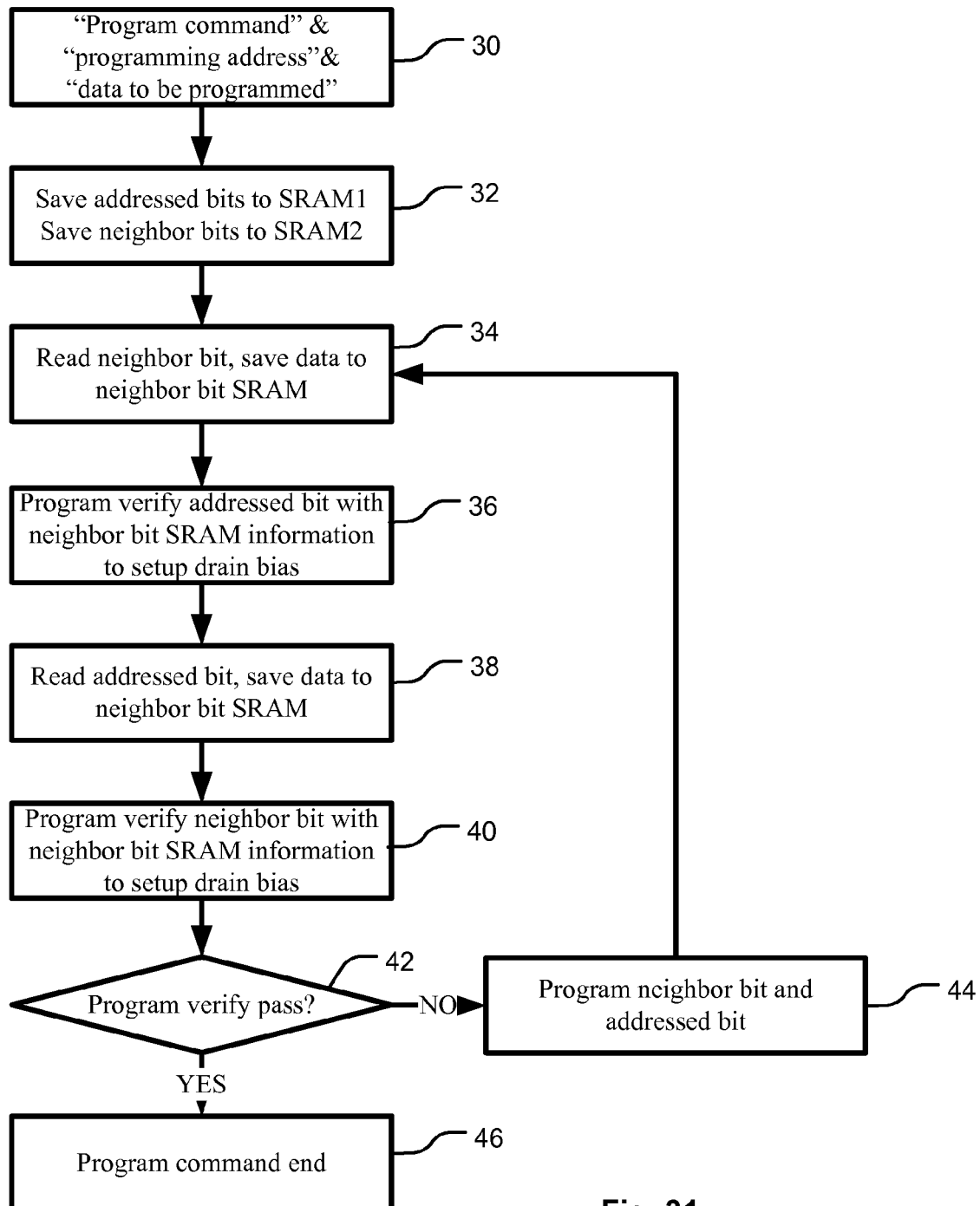
FIGS. 31-33 are process flows of a program operation with an adjusted drain bias depending on the value of the neighboring bit.
Figure 32:
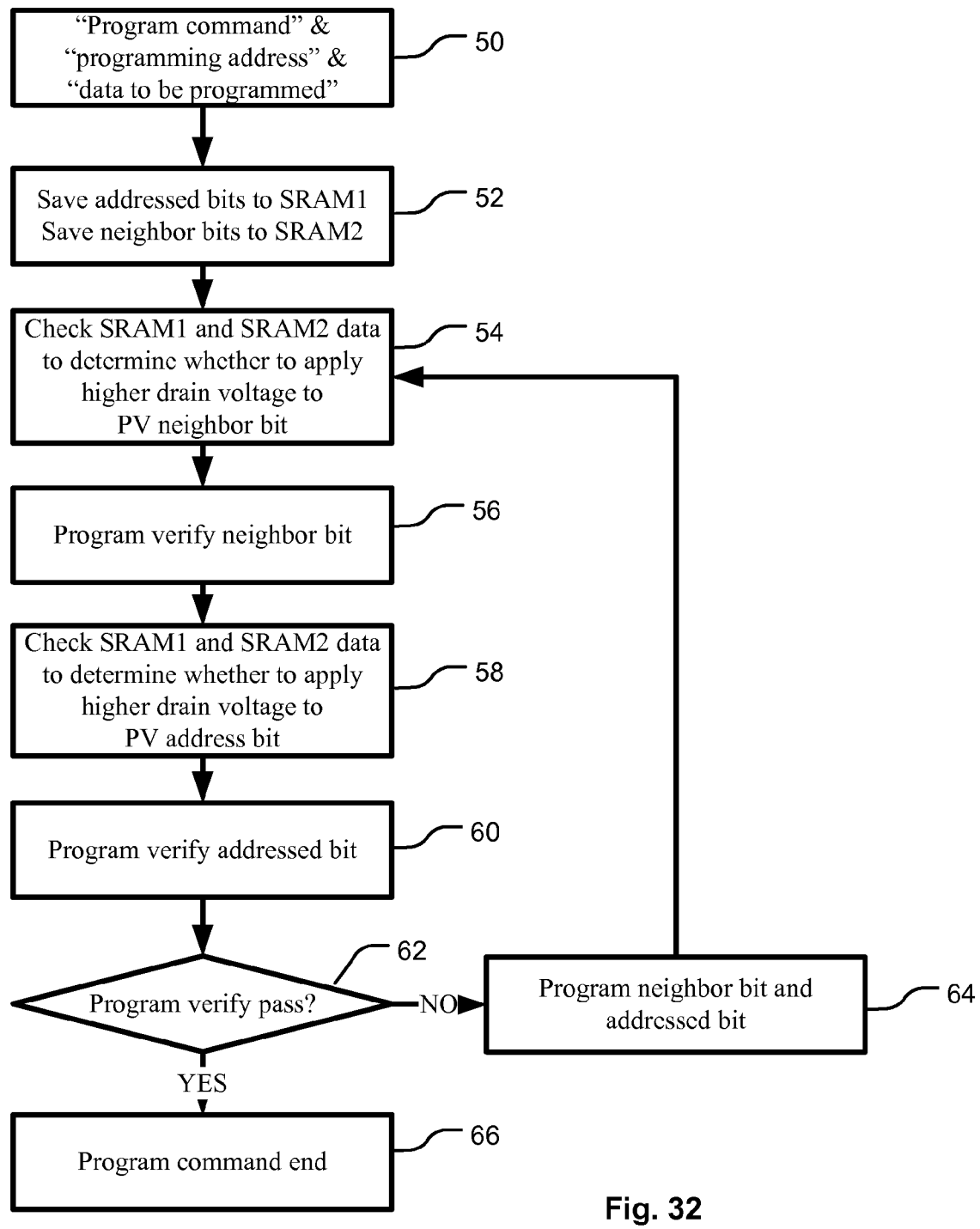
Figure 33:
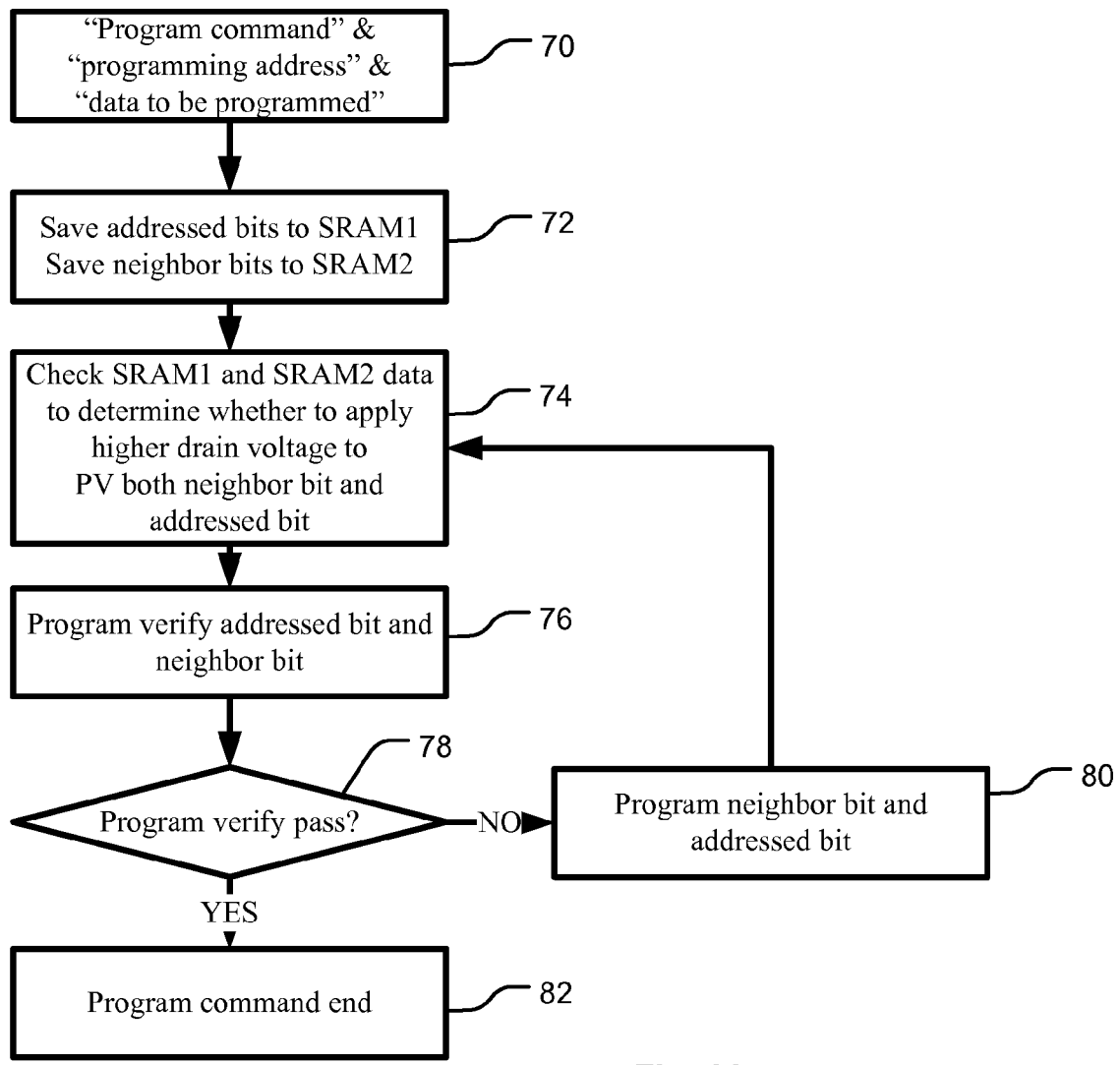

FIGS. 31-33 are process flows of a program operation with an adjusted drain bias depending on the value of the neighboring bit. In FIG. 31, the drain voltages are initially determined based on sensed data. In FIGS. 32 and 33, the drain voltages are initially determined based on input data accompanying the program command.

In FIG. 31, at 30, the program command is received with a programming address, and the data to be programmed. At 32, based on the data to be programmed received at 30, the contents to be programmed to the addressed bits are processed to determine whether the corresponding VT exceeds a threshold VT as shown in FIG. 6, and the result is saved to SRAM1, and the contents to be programmed to the neighbor bits are processed to determine whether the corresponding VT exceeds a threshold VT as shown in FIG. 6, and the result is saved to SRAM2. At 34, the neighbor bit is read, with a default low drain voltage. As shown in FIG. 6, data is saved that indicates whether the neighbor bit value has a sufficiently high VT to permit the high drain voltage for the sensing the addressed bit. An example memory saving the data is shown at FIG. 28. At 36, the addressed bit is program verified with a low or high drain voltage, depending on the data saved at 34. At 38, the addressed bit is read, with a default low drain voltage. Data is saved that indicates whether the addressed bit value has a sufficiently high VT to permit the high drain voltage for the sensing the neighbor bit. At 40, the neighbor bit is program verified with a low or high drain voltage, depending on the data saved at 38. At 42, it determined whether the program verify operations at 36 and 40 passed. At 44, if either or both program verify operations at 36 and 40 failed, then the neighbor bit and/or the addressed bit are programmed, and the process flow repeats from 34. At 46, if program verify operations at 36 and 40 passed, the program command ends.

In FIG. 32, at 50, the program command is received with a programming address, and the data to be programmed. At 52, based on the data to be programmed received at 50, the contents to be programmed to the addressed bits are processed to determine whether the corresponding VT exceeds a threshold VT as shown in FIG. 6, and the result is saved to SRAM1, and the contents to be programmed to the neighbor bits are processed to determine whether the corresponding VT exceeds a threshold VT as shown in FIG. 6, and the result is saved to SRAM2. At 54, the SRAM1 and SRAM2 data are checked to determine whether to apply higher drain voltage to program verify neighbor bit. SRAM1 and SRAM2 are checked, because the contents of both the address bit and the neighbor bit determine the VT, as shown in FIGS. 24-25. At 56, the neighbor bit is program verified, with a drain voltage depending on the SRAM1 data of the addressed bit. At 58, the SRAM1 and SRAM2 data are checked to determine whether to apply higher drain voltage to program verify the addressed bit. SRAM1 and SRAM2 are checked, because the contents of both the address bit and the neighbor bit determine the VT, as shown in FIGS. 24-25. At 60, the addressed bit is program verified, with a drain voltage depending on the SRAM2 data of the neighbor bit. At 62, it determined whether the program verify operations at 56 and 60 passed. At 64, if either or both program verify operations at 56 and 60 failed, then the neighbor bit and/or the addressed bit are programmed, and the process flow repeats from 54. At 66, if program verify operations at 56 and 60 passed, the program command ends.

In FIG. 33, at 70, the program command is received with a programming address, and the data to be programmed. At 72, based on the data to be programmed received at 70, the contents to be programmed to the addressed bits are processed to determine whether the corresponding VT exceeds a threshold VT as shown in FIG. 6, and the result is saved to SRAM1, and the contents to be programmed to the neighbor bits are processed to determine whether the corresponding VT exceeds a threshold VT as shown in FIG. 6, and the result is saved to SRAM2. At 74, the SRAM1 data and the SRAM2 data are checked to determine whether to apply higher drain voltage to program verify the addressed bit and the neighbor bit. SRAM1 and SRAM2 are checked, because the contents of both the address bit and the neighbor bit determine the VT, as shown in FIGS. 24-25. At 76, the neighbor bit is program verified, with a drain voltage depending on the SRAM1 data of the addressed bit, and the addressed bit is program verified, with a drain voltage depending on the SRAM2 data of the neighbor bit. At 78, it determined whether the program verify operation at 76 passed. At 80, if the program verify operation at 76 failed, then the neighbor bit and/or the addressed bit are programmed, and the process flow repeats from 74. At 82, if program verify operation at 76 passed, the program command ends.

Figure 34:
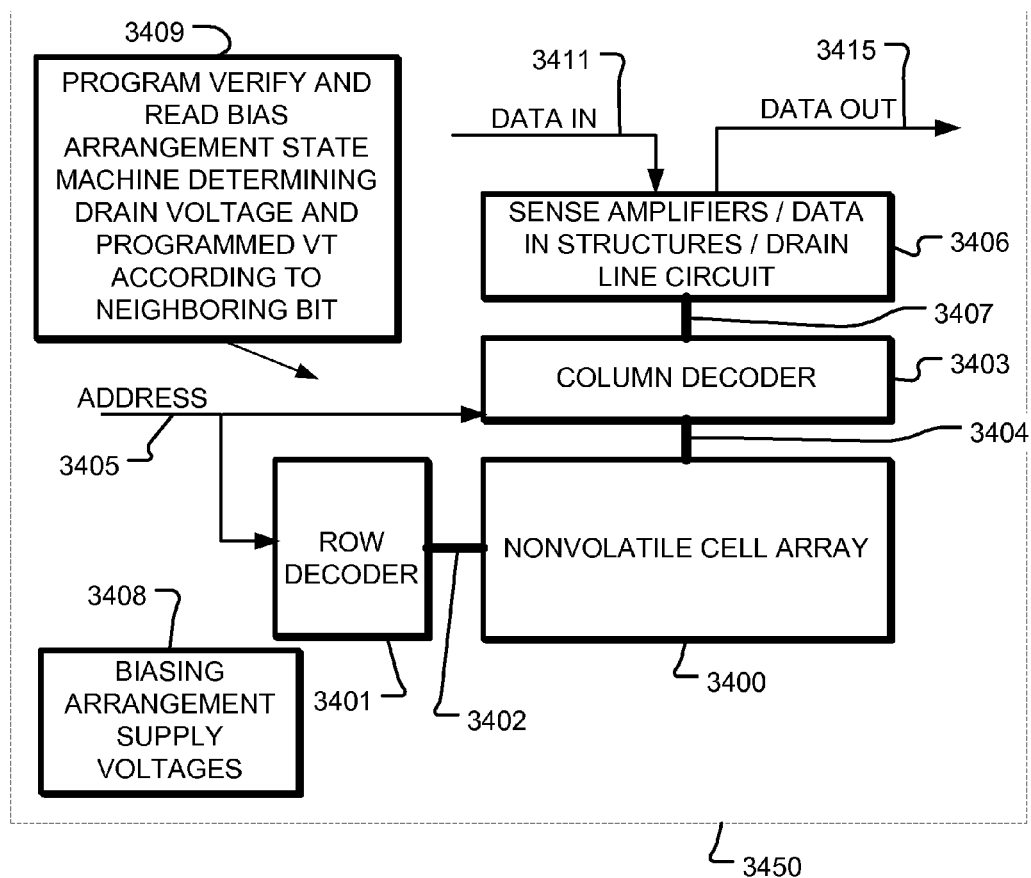
FIG. 34 is a block diagram of an integrated circuit with a memory array and improvements described herein.

FIG. 34 is a block diagram of an integrated circuit with a memory array and improvements described herein. An integrated circuit 3450 includes a memory array 3400. A word line (or row) and block select decoder 3401 is coupled to, and in electrical communication with, a plurality 3402 of word lines and string select lines, and arranged along rows in the memory array 3400. A bit line (column) decoder and drivers 3403 are coupled to and in electrical communication with a plurality of bit lines 3404 arranged along columns in the memory array 3400 for reading data from, and writing data to, the memory cells in the memory array 3400. Addresses are supplied on bus 3405 to the word line decoder and drivers 3401 and to the bit line decoder 3403. Sense amplifiers and data-in structures in block 3406, including the drain line circuit and SRAM memory such shown in FIG. 28, are coupled to the bit line decoder 3403 via the bus 3407. Data is supplied via the data-in line 3434 from input/output ports on the integrated circuit 3450, to the data-in structures in block 3406. Data is supplied via the data-out line 3415 from the sense amplifiers in block 3406 to input/output ports on the integrated circuit 3450, or to other data destinations internal or external to the integrated circuit 3450. Program verify and read bias arrangement state machine circuitry 3409 determines the drain voltage and programmed VT according to the neighboring bit of an address bit in the same memory cell, and controls biasing arrangement supply voltages 3408.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
 a nonvolatile memory cell including:
  a first current carrying terminal, a second current carrying terminal, and a gate;
  a first storage part proximate to the first current carrying terminal and storing first data; and
  a second storage part proximate to the second current carrying terminal and storing second data;
 control circuitry applying a read bias arrangement to the first current carrying terminal, the second current carrying terminal, and the gate, the read bias arrangement applied to read one of the first data and the second data, the read bias arrangement depending on the other of the first data and the second data.

2. The integrated circuit of claim 1,
 wherein the first data determines a first voltage applied to the first current carrying terminal in the read bias arrangement applied to read the second data, and
 wherein the second data determines a second voltage applied to the second current carrying terminal in the read bias arrangement applied to read the first data.

3. The integrated circuit of claim 1, wherein responsive to the first data being represented by a first threshold voltage of the first storage part exceeding a minimum threshold voltage, a first voltage is applied to the first current carrying terminal in the read bias arrangement applied to read the second data,
responsive to the first data being represented by a second threshold voltage of the first storage part not exceeding a minimum threshold voltage, a second voltage is applied to the first current carrying terminal in the read bias arrangement applied to read the second data, and
the first voltage is higher than the second voltage.

4. The integrated circuit of claim 3, further comprising:
a memory storing data bits determined by whether the first data is represented by a threshold voltage that exceeds a minimum threshold voltage, wherein the control circuitry reads the data bits from the memory to control whether the first voltage or the second voltage is applied to the first current carrying terminal in the read bias arrangement applied to read the second data.

5. The integrated circuit of claim 1, wherein the first data and the second data each are one of a plurality of data values, the plurality of data values having a first total of data values, the plurality of data values represented by a plurality of programmed threshold voltage ranges, the plurality of programmed threshold voltage ranges having a second total of programmed threshold voltage ranges, the second total exceeding the first total.

6. The integrated circuit of claim 1, wherein the first data and the second data each are one of a plurality of data values, the plurality of data values represented by a plurality of programmed threshold voltage ranges, a data value of the plurality of data values represented by multiple programmed threshold voltage ranges from the plurality of programmed threshold voltage ranges.

7. The integrated circuit of claim 1, wherein the first data and the second data each are one of a plurality of data values, the plurality of data values represented by a plurality of programmed threshold voltage ranges, a data value of the plurality of data values represented by multiple programmed threshold voltage ranges from the plurality of programmed threshold voltage ranges, the first data represented by a particular one of the multiple programmed threshold voltage ranges depending on the second data.

8. The integrated circuit of claim 1, wherein the first storage part and the second storage part are different parts of a nitride storage layer.

9. The integrated circuit of claim 1, wherein each of the first data and the second data are multiple bits.

10. The integrated circuit of claim 1, wherein prior to applying the read bias arrangement depending on the other of the first data and the second data, a read operation determines the other of the first data and the second data.

11. A memory method, comprising:
applying a read bias arrangement to a first current carrying terminal, a second current carrying terminal, and a gate of a nonvolatile memory cell, the read bias arrangement applied to read one of first data and the second data, the read bias arrangement depending on the other of the first data and the second data, the first data stored at a first storage part proximate to the first current carrying terminal and the second data stored at a second storage part proximate to the second current carrying terminal.

* * * * *